United States Patent
Kondo et al.

(10) Patent No.: US 9,267,846 B2
(45) Date of Patent: Feb. 23, 2016

(54) INFRARED DETECTION ELEMENT, INFRARED DETECTION MODULE, AND MANUFACTURING METHOD THEREFOR

(71) Applicant: NGK INSULATORS, LTD., Aichi (JP)

(72) Inventors: Jungo Kondo, Miyoshi (JP); Kenji Suzuki, Nagoya (JP)

(73) Assignee: NGK INSULATORS, LTD., Aichi (JP)

( * ) Notice: Subject to any disclaimer, the term of this patent is extended or adjusted under 35 U.S.C. 154(b) by 0 days.

(21) Appl. No.: 14/295,820

(22) Filed: Jun. 4, 2014

(65) Prior Publication Data

US 2014/0284482 A1 Sep. 25, 2014

Related U.S. Application Data

(63) Continuation of application No. PCT/JP2012/080926, filed on Nov. 29, 2012.

(30) Foreign Application Priority Data

Dec. 5, 2011 (JP) .................. 2011-265832

(51) Int. Cl.
- *G01J 5/00* (2006.01)
- *G01J 5/04* (2006.01)
- *H01L 37/02* (2006.01)
- *G01J 5/34* (2006.01)

(52) U.S. Cl.
CPC .. *G01J 5/046* (2013.01); *G01J 5/34* (2013.01); *H01L 37/02* (2013.01); *Y10T 156/10* (2015.01)

(58) Field of Classification Search
CPC .............................. G01J 6/34; H01L 27/14669
See application file for complete search history.

(56) References Cited

U.S. PATENT DOCUMENTS

| | | | | |
|---|---|---|---|---|
| 3,654,466 | A | * | 4/1972 | Abrams et al. ................. 250/349 |
| 3,813,550 | A | * | 5/1974 | Abrams et al. ............. 250/338.3 |
| 4,284,888 | A | * | 8/1981 | Appleby .................... 250/338.3 |
| 5,006,711 | A | * | 4/1991 | Hamashima et al. ......... 250/349 |

(Continued)

FOREIGN PATENT DOCUMENTS

| | | |
|---|---|---|
| JP | 62-046217 A | 2/1987 |
| JP | 62-285029 A | 12/1987 |

(Continued)

OTHER PUBLICATIONS

International Search Report for PCT Patent App. No. PCT/JP2012/080926 (Jan. 8, 2013).

(Continued)

*Primary Examiner* — Kiho Kim
(74) *Attorney, Agent, or Firm* — Cermak Nakajima & McGowan LLP; Tomoko Nakajima

(57) ABSTRACT

In an infrared detection element 15, a first substrate 36 is bonded to a front side of a pyroelectric substrate 20. Since the thermal expansion coefficient of the first substrate 36 is lower than that of the pyroelectric substrate 20, deformation of the pyroelectric substrate 20 due to thermal expansion can be suppressed by the first substrate 36. Further, since a thermal expansion coefficient difference D is 8.9 ppm/K or less, the thermal expansion coefficient between the first substrate 36 and the pyroelectric substrate 20 is not excessively large, and this can suppress deformation of the infrared detection element 15 due to the thermal expansion coefficient difference between the first substrate 36 and the pyroelectric substrate 20.

8 Claims, 8 Drawing Sheets

(56) References Cited

U.S. PATENT DOCUMENTS

| | | | |
|---|---|---|---|
| 5,620,740 A | * | 4/1997 | Baliga et al. .................. 427/100 |
| 2013/0020484 A1 | | 1/2013 | Tai et al. |

FOREIGN PATENT DOCUMENTS

| | | |
|---|---|---|
| JP | 05-235428 A | 9/1993 |
| JP | 10-038679 A | 2/1998 |
| JP | 2000-164946 A | 6/2000 |
| JP | 2006-203009 A | 8/2006 |
| WO | WO2012/114579 A1 | 8/2012 |

OTHER PUBLICATIONS

Written Opinion for PCT Patent App. No. PCT/JP2012/080926 (Jan. 8, 2013).

International Preliminary Report on Patentability for PCT Patent App. No. PCT/JP2012/080926 (Jun. 19, 2014).

* cited by examiner (a)

(b)

(c)

INFRARED DETECTION ELEMENT, INFRARED DETECTION MODULE, AND MANUFACTURING METHOD THEREFOR

BACKGROUND OF THE INVENTION

1. Field of the Invention

The present invention relates to an infrared detection element, an infrared detection module, and a manufacturing method therefor.

2. Description of the Related Art

Pyroelectric elements have been used as infrared detection elements in infrared detection modules for security and gas detection purposes. A pyroelectric element includes a pyroelectric substrate and a pair of front-side and back-side electrodes provided on front and back sides of the pyroelectric substrate, respectively. When a surface of the pyroelectric element is irradiated with infrared light, the temperature of the pyroelectric substrate increases. Then, the change in temperature changes spontaneous polarization, disturbs the balance of electric charge on the surface of the pyroelectric substrate, and causes generation of electric charge. By extracting the generated electric charge through conductive wires connected to the pair of electrodes, the infrared light is detected. As an infrared detection module including such a pyroelectric element, an infrared detection module is known in which a pyroelectric element is fixed to a circuit board with conductive adhesive materials and electric charge generated on the pyroelectric substrate is extracted to the circuit board via the conductive adhesive materials (for example, PTL 1).

CITATION LIST

Patent Literature

PTL 1: Japanese Unexamined Patent Application Publication No. 10-38679

SUMMARY OF INVENTION

Technical Problem

When deformation, such as warpage, is caused in the pyroelectric substrate used in the infrared detection element by thermal expansion, voltage is generated by a piezoelectric effect. Thus, this voltage sometimes appears as noise. For this reason, there is a demand to suppress deformation of the pyroelectric substrate due to thermal expansion in the infrared detection element.

The present invention has been made in view of such a problem, and a primary object of the invention is to further suppress deformation of a pyroelectric substrate.

Solution to Problem

The present invention adopts the following means to achieve the above-described primary object.

An infrared detection element of the present invention includes:
a pyroelectric substrate;
a front-side electrode provided on a front side of the pyroelectric substrate;
a back-side electrode provided on a back side of the pyroelectric substrate to be opposed to the front-side electrode; and
a first substrate bonded to the front side of the pyroelectric substrate and having a thermal expansion coefficient lower than a thermal expansion coefficient of the pyroelectric substrate,
wherein the first substrate has a cavity opposed to the front-side electrode, and a thermal expansion coefficient difference D obtained by subtracting the thermal expansion coefficient of the first substrate from the thermal expansion coefficient of the pyroelectric substrate is 8.9 ppm/K or less.

In this infrared detection element, the first substrate is bonded to the front side of the pyroelectric substrate. Further, the thermal expansion coefficient of the first substrate is lower than the thermal expansion coefficient of the pyroelectric substrate. Hence, deformation of the pyroelectric substrate due to thermal expansion can be suppressed by the first substrate. Since the thermal expansion coefficient difference D is 8.9 ppm/K or less, the thermal expansion coefficient difference between the first substrate and the pyroelectric substrate is not excessively large, and deformation of the infrared detection element due to the thermal expansion coefficient difference between the first substrate and the pyroelectric substrate can be suppressed. Owing to these, deformation of the pyroelectric substrate can be suppressed further. In this case, the thermal expansion coefficient difference D is preferably 8.3 ppm/K or less, and more preferably 8 ppm/K or less. The thermal expansion coefficient difference D may be 5 ppm/K or more.

In the infrared detection element of the present invention, the pyroelectric substrate may have a thickness of 10 μm or less (for example, within the range of 1 to 10 μm). In recent years, applications to security and gas detection have been required to have high sensitivity and high-speed response, and there has been a demand to reduce the thickness of the pyroelectric substrate. However, if the thickness is reduced, piezoelectric noise is liable to be caused by deformation of the pyroelectric substrate. Since the infrared detection element of the present invention can further suppress deformation of the pyroelectric substrate, it is highly significant to apply the present invention to a case in which the thickness of the pyroelectric substrate is reduced.

In the infrared detection element of the present invention, the pyroelectric substrate may be a Y-offcut plate obtained by cutting a single crystal of lithium tantalate at an angle turned by a cut angle θ (0°<θ<90°, 90°<θ<180°) from a Y-axis toward a Z-axis about an X-axis that coincides with a direction along surfaces of the electrodes. Since lithium tantalate ($LiTaO_3$, hereinafter referred to as "LT") has a high pyroelectric coefficient and a high performance index, when it is used for the pyroelectric substrate, sensitivity of the infrared detection element can be increased. Further, popcorn noise caused by a change in the environmental temperature can be reduced by using the Y-offcut plate of LT. Moreover, a wafer having a diameter larger than that of a Z-cut plate can be used, and this can increase the number of chips to be cut out from a single wafer. In this case, the cut angle θ is preferably within the range of 30° to 60° or the range of 120° to 150°. When the cut angle θ is 60° or less or 150° or less, the occurrence of popcorn noise in the infrared detection element can be suppressed further. When the cut angle θ is 30° or more or 120° or more, degradation of the S/N ratio can be suppressed further. When the pyroelectric substrate is formed by a Y-offcut plate of LT, since the thermal expansion coefficient of the Y-offcut plate of LT is about 17 ppm/K, the thermal expansion coefficient difference D between the first substrate and the pyroelectric substrate can be made more than 0 ppm/K and less than 9 ppm/K by setting the thermal expansion coefficient of the first substrate to be more than 8 ppm/K and to be lower than that of the pyroelectric substrate. The S/N ratio of the infrared detection element tends to decrease as the thickness of the Y-offcut plate of LT increases above 10 μm. Hence, the thickness is preferably 10 μm or less. When the thickness of the Y-offcut plate of LT is less than 5 μm, the voltage sensitivity of the infrared detection element tends to decrease as the thickness decreases. Hence, the thickness is preferably 5 μm or more.

An infrared detection module according to the present invention includes the infrared detection element according to any of the above-described modes, and a second substrate bonded to the back side of the pyroelectric substrate and having a thermal expansion coefficient lower than the thermal expansion coefficient of the pyroelectric substrate.

In this infrared detection module, since the thermal expansion coefficient of the second substrate is lower than the thermal expansion coefficient of the pyroelectric substrate, deformation of the pyroelectric substrate due to thermal expansion can be suppressed not only by the first substrate but also by the second substrate. This can further suppress deformation of the pyroelectric substrate.

The infrared detection module according to the present invention may further include a conductive adhesive material that bonds the infrared detection element and the second substrate to electrically connect the back-side electrode and the second substrate and is located such that at least a part thereof overlaps with the first substrate when the infrared detection element is virtually seen through from the first substrate side. This can further suppress deformation of the pyroelectric substrate due to thermal expansion of the conductive adhesive material when the pyroelectric substrate is pushed up by the thermal expansion of the conductive adhesive material. In this case, the second substrate may have a thermal expansion coefficient lower than that of the first substrate.

In the present invention, a manufacturing method for an infrared detection module in which an infrared detection element is bonded to a second substrate with a conductive adhesive material, the infrared detection element including a pyroelectric substrate, a front-side electrode provided on a front side of the pyroelectric substrate, a back-side electrode provided on a back side of the pyroelectric substrate to be opposed to the front-side electrode, and a first substrate bonded to the front side of the pyroelectric substrate and having a cavity opposed to the front-side electrode, the first substrate having a thermal expansion coefficient lower than a thermal expansion coefficient of the pyroelectric substrate such that a thermal expansion coefficient difference D obtained by subtracting the thermal expansion coefficient of the first substrate from the thermal expansion coefficient of the pyroelectric substrate is 8.9 ppm/K or less, the manufacturing method comprising:

(a) a step of preparing the infrared detection element;

(b) a step of bonding the second substrate to the back side of the pyroelectric substrate with the conductive adhesive material to electrically connect the infrared detection element and the second substrate; and (c) a step of bonding the infrared detection element to the second substrate with the conductive adhesive material by applying a load between the first substrate and the second substrate, wherein, in the step (b), the bonding is performed such that the conductive adhesive material is located at a position where at least a part of the conductive adhesive material overlaps with the first substrate when the infrared detection element is virtually seen through from the first substrate side.

In this manufacturing method for the infrared detection module, the second substrate is bonded to the back side of the pyroelectric substrate with the conductive adhesive material, and the infrared detection element is bonded to the second substrate with the conductive adhesive material by imposing a load between the first substrate and the second substrate. At this time, the pyroelectric substrate and the second substrate are bonded such that the conductive adhesive material is located at a position such that at least a part thereof overlaps with the first substrate when the infrared detection element is virtually seen through from the first substrate side. For this reason, load is applied onto a portion of the pyroelectric substrate where the conductive adhesive material is attached, but stress due to this load can be received by the first substrate. Thus, it is possible to further suppress deformation of the pyroelectric substrate due to this stress. In the infrared detection module manufactured by the manufacturing method for the infrared detection module, the thermal expansion coefficient of the first substrate is lower than that of the pyroelectric substrate, and the thermal expansion coefficient difference D is 8.9 ppm/K or less. For this reason, similarly to the infrared detection element and the infrared detection module of the present invention described above, an effect of further suppressing deformation of the pyroelectric substrate due to thermal expansion can be obtained. In the manufacturing method for the infrared detection module, various modes of the infrared detection element and the infrared detection module described above may be adopted.

DESCRIPTION OF EMBODIMENTS

Figure 1:
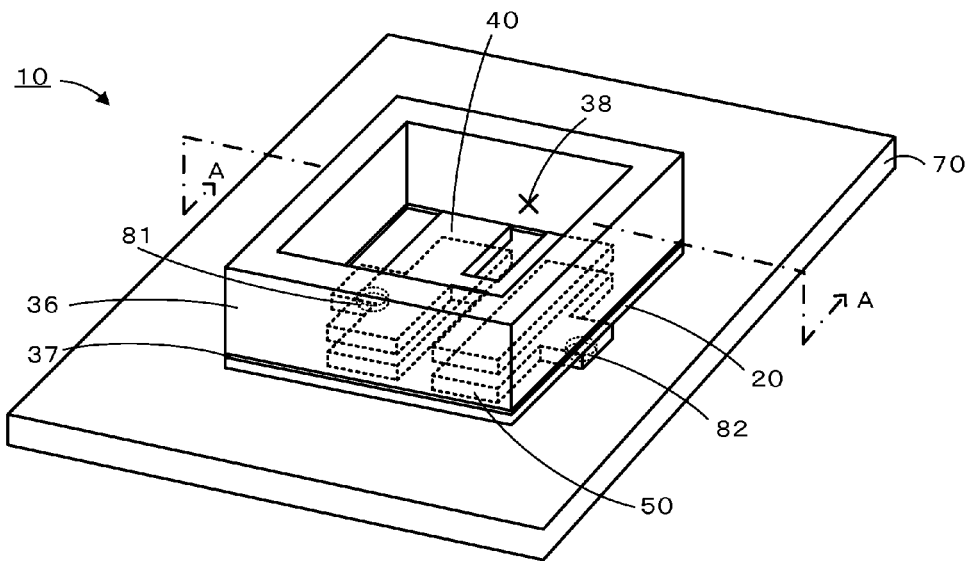
FIG. 1 is a schematic perspective view of an infrared detection module 10.
Figure 2:
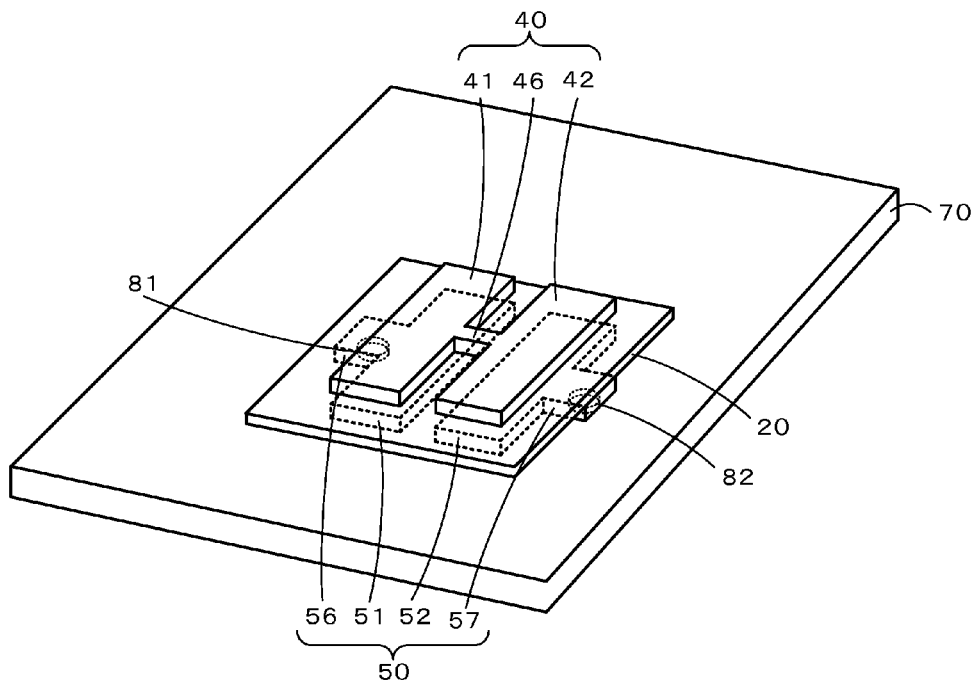
FIG. 2 is a schematic perspective view of the infrared detection module 10 from which a first substrate 36 and a bonding layer 37 in FIG. 1 are removed for convenience of explanation.
Figure 3:
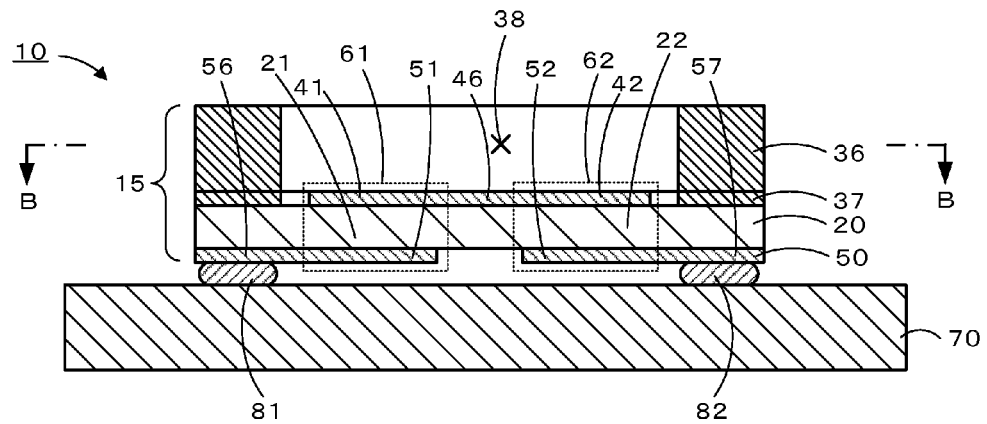
FIG. 3 is a cross-sectional view taken along line A-A of FIG. 1.
Figure 4:
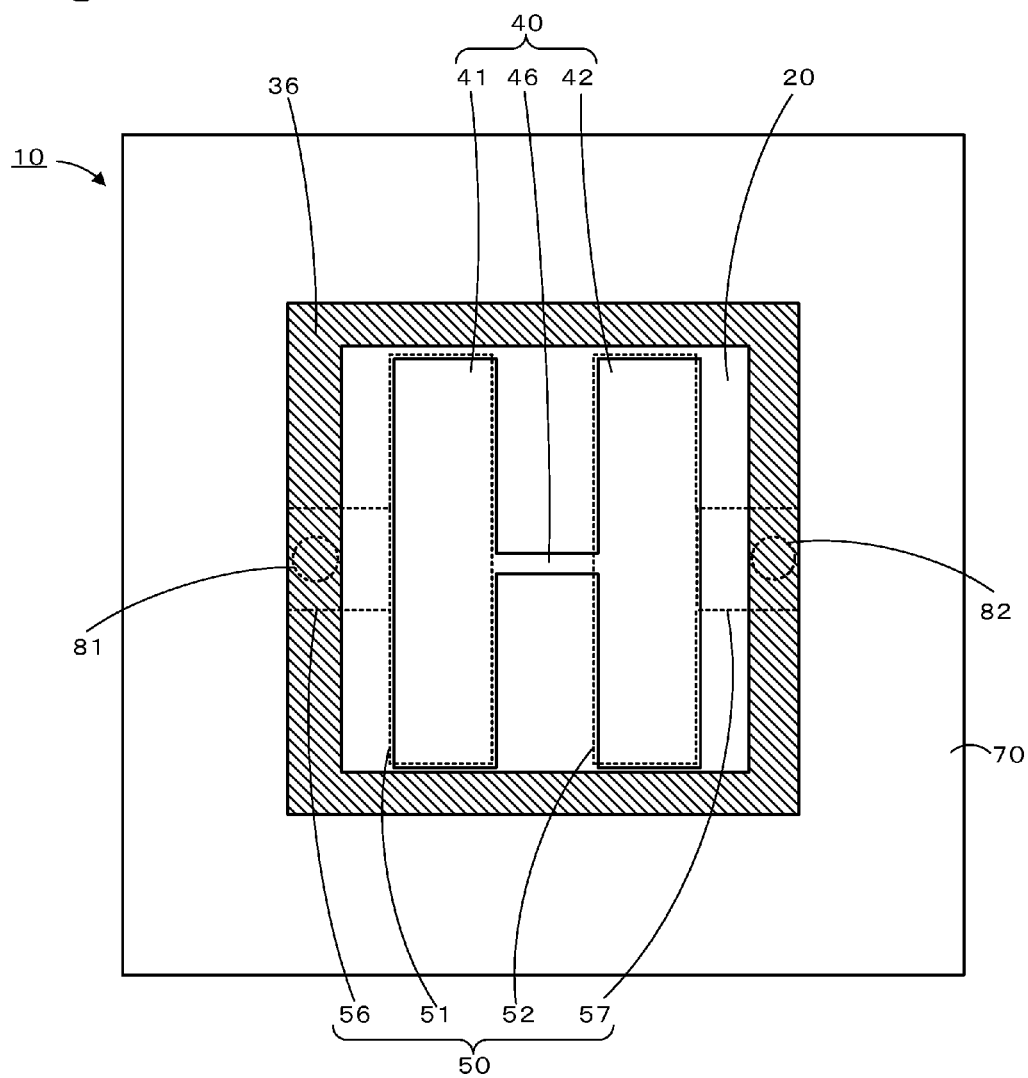
FIG. 4 is a cross-sectional view taken along line B-B of FIG. 3.
Figure 5:
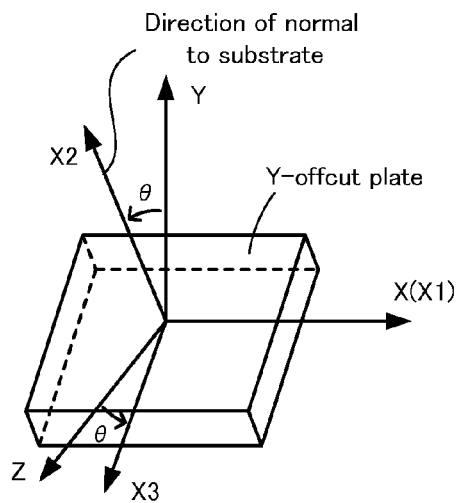
FIG. 5 is an explanatory view illustrating a cut angle of a Y-offcut plate.

FIG. 1 is a schematic perspective view of an infrared detection module 10 according to an embodiment of the present invention, FIG. 2 is a schematic perspective view of the infrared detection module 10 from which a first substrate 36 and a bonding layer 37 in FIG. 1 are removed for convenience of explanation, FIG. 3 is a cross-sectional view taken along line A-A of FIG. 1, FIG. 4 is a cross-sectional view taken along line B-B of FIG. 3, and FIG. 5 is an explanatory view illustrating a cut angle of a Y-offcut plate.

The infrared detection module 10 includes an infrared detection element 15 configured as a dual type infrared detection element (pyroelectric element) having two light receiving sections 61 and 62 (see FIG. 3), a second substrate 70 that supports the infrared detection element 15 from a back side, and conductive adhesive materials 81 and 82 that bond the infrared detection element 15 and the second substrate 70 to fix the infrared detection element 15 to the second substrate 70.

The infrared detection element 15 is configured as a dual type infrared detection element including two light receiving sections 61 and 62. The infrared detection element 15 includes a pyroelectric substrate 20, a front-side metal layer 40 provided on a front side of the pyroelectric substrate 20, a back-side metal layer 50 provided on a back side of the pyroelectric substrate 20, and a first substrate 36 bonded to the front side of the pyroelectric substrate 20 with a bonding layer 37 being disposed therebetween.

The pyroelectric substrate 20 is a substrate of LT single crystal having an X-axis, a Y-axis, and a Z-axis as crystal axes. As illustrated in FIG. 5, the pyroelectric substrate 20 is a Y-offcut plate obtained by cutting the LT single crystal at an angle turned by a cut angle θ from the Y-axis toward the Z-axis about the X-axis that coincides with a direction along the substrate surface (electrode surfaces). In this Y-offcut plate, when X1 represents a direction along the electrode surfaces, X2 represents a direction of the normal to the electrode surfaces, and X3 represents an axis orthogonal to both X1 and X2, X1 coincides with the X-axis, X2 is an axis turned by the cut angle θ from the Y-axis toward the Z-axis about the X-axis, and X3 is an axis turned by the cut angle θ from the Z-axis in accordance with the turn of X2. The cut angle θ is set within the range such that 0°<θ<90° or 90°<θ<180°. Since LT has a high pyroelectric coefficient and a high performance index, sensitivity of the infrared detection element 15 can be increased by using LT in the pyroelectric substrate 20. By using the Y-offcut plate of LT, popcorn noise caused by change in environmental temperature can be reduced. Further, a wafer having a diameter larger than that of a Z-cut plate can be used, and this can increase the number of chips to be cut out from a single wafer. Preferably, the cut angle θ is within the range of 30° to 60° or the range of 120° to 150°. When the cut angle θ is 60° or less or 150° or less, the occurrence of popcorn noise in the infrared detection element can be suppressed further. When the cut angle θ is 30° or more or 120° or more, degradation of the S/N ratio can be suppressed further. The thickness of the pyroelectric substrate 20 is 10 μm or less (for example, 0.1 to 10 μm), preferably 1 to 10 μm, and more preferably 5 to 10 μm. By setting the thickness of the pyroelectric substrate 20 formed by the LT Y-offcut plate at 10 μm or less, degradation of the S/N ratio of the infrared detection element 15 can be suppressed further. By setting the thickness of the pyroelectric substrate 20 formed by the LT Y-offcut plate at 5 μm or more, degradation of voltage sensitivity of the infrared detection element 15 can be suppressed further. For example, the pyroelectric substrate 20 is 0.1 to 5 mm in length and 0.1 to 5 mm in width.

The front-side metal layer 40 is provided on the front side of the pyroelectric substrate 20, and includes two front-side electrodes 41 and 42 each shaped like a longitudinally long rectangle in plan view, and a front-side electrode lead portion 46 that electrically connects the front-side electrode 41 and the front-side electrode 42 and is shaped like a laterally long rectangle in plan view. As an example of a material of the front-side metal layer 40, metal such as nickel, chromium, or gold, is given. A material having higher infrared absorptivity is more preferable, and gold black may be used. The thickness of the front-side metal layer 40 is not particularly limited, but is 0.01 to 0.2 μm for example. The front-side metal layer 40 may have a double-layer structure composed of a metal layer of chromium formed on the front side of the pyroelectric substrate 20 and a metal layer of nickel formed on the metal layer of chromium.

The back-side metal layer 50 is provided on the back side of the pyroelectric substrate 20, and includes two back-side electrodes 51 and 52 each shaped like a longitudinally long rectangle in plan view, a back-side electrode lead portion 56 electrically connected to the back-side electrode 51 and shaped like a square in plan view, and a back-side electrode lead portion 57 electrically connected to the back-side electrode 52 and shaped like a square in plan view. The material and thickness of the back-side metal layer 50 can be similar to those of the above-described front-side metal layer 40. The back-side electrode 51 is provided on the back side of the pyroelectric substrate 20 to be opposed to the front-side electrode 41, and the back-side electrode 52 is provided on the back side of the pyroelectric substrate 20 to be opposed to the front-side electrode 42. The back-side electrode lead portions 56 and 57 are each located such that at least a part thereof overlap with the first substrate 36 when the infrared detection element 15 is virtually seen through from the first substrate 36 side (see FIG. 4). In other words, at least a part of each of the back-side electrode lead portions 56 and 57 is provided just below the first substrate 36 in FIG. 3. In FIG. 4, the positions of the back-side metal layer 50 and the conductive adhesive materials 81 and 82 when the infrared detection element 15 is virtually seen through from the first substrate 36 side are shown by dashed lines.

The light receiving section 61 is composed of a pair of electrodes (front-side electrode 41 and back-side electrode 51), and a light receiving region 21 serving as a portion of the pyroelectric substrate 20 interposed between the front-side electrode 41 and the back-side electrode 51. Similarly, the light receiving section 62 is composed of a pair of electrodes (front-side electrode 42 and back-side electrode 52), and a light receiving region 22 serving as a portion of the pyroelectric substrate 20 interposed between the front-side electrode 42 and the back-side electrode 52. Sides of the light receiving sections 61 and 62 where the front-side electrodes 41 and 42 are provided are formed as light receiving surfaces to be irradiated with infrared light. In the light receiving sections 61 and 62, when the temperature is changed by irradiation with infrared light, a voltage between the pair of electrodes changes. For example, when the light receiving section 61 is irradiated with infrared light, the front-side electrode 41 and the light receiving region 21 absorb the infrared light, and this causes a change in temperature. Then, the resulting change in spontaneous polarization in the light receiving region 21 appears as a change in voltage between the front-side electrode 41 and the back-side electrode 51.

The first substrate 36 is a member shaped like a frame that has therein a rectangular cavity 38 opposed to the front-side electrodes 41 and 42 and that surrounds the cavity 38 in a rectangular form. The first substrate 36 has the cavity 38 to avoid the front-side electrodes 41 and 42 serving as the light receiving surfaces of the light receiving sections 61 and 62, and surrounds the periphery of the front-side electrodes 41 and 42 in a rectangular form. Examples of materials of the first substrate 36 are glass, magnesium oxide, and crystal. Although not particularly limited, for example, the first substrate 36 is 0.1 to 5 mm in length, 0.1 to 5 mm in width, and 0.15 to 5 mm in thickness. The bonding layer 37 bonds the first substrate 36 and the pyroelectric substrate 20. As the material of the bonding layer 37, a material obtained by solidifying epoxy adhesive or acrylic adhesive is given as an example. Although not particularly limited, for example, the thickness of the bonding layer 37 is 0.1 to 1 µm. Without using the bonding layer 37, the pyroelectric substrate 20 and the first substrate 36 may be bonded by a direct bonding method such as anodic bonding. Preferably, the material of each of the first substrate 36 and the bonding layer 37 has a thermal conductivity lower than that of the pyroelectric substrate 20.

The first substrate 36 has a thermal expansion coefficient lower than that of the pyroelectric substrate 20. A thermal expansion coefficient difference D obtained by subtracting the thermal expansion coefficient of the first substrate 36 from the thermal expansion coefficient of the pyroelectric substrate 20 is 8.9 ppm/K or less. Since the thermal expansion coefficient of the first substrate 36 is lower than that of the pyroelectric substrate 20, deformation of the pyroelectric substrate 20 due to thermal expansion can be suppressed by the first substrate 36. Further, since the thermal expansion coefficient difference D is 8.9 ppm/K or less, the thermal expansion coefficient difference between the first substrate 36 and the pyroelectric substrate 20 is not excessively large, and this can suppress deformation of the infrared detection element 15 due to the thermal expansion coefficient difference between the first substrate 36 and the pyroelectric substrate 20. In this case, the thermal expansion coefficient difference D is preferably 8.3 ppm/K or less, and more preferably 8 ppm/K or less. The thermal expansion coefficient difference D may be 5 ppm/K or more. When the pyroelectric substrate 20 is formed by a Y-offcut plate of LT, since the thermal expansion coefficient of the first substrate 36 is about 17 ppm/K, the thermal expansion coefficient difference D between the first substrate 36 and the pyroelectric substrate 20 is made 8.9 ppm/K or less by setting the thermal expansion coefficient of the first substrate 36 at 8.1 ppm/K or more. The thermal expansion coefficient of the first substrate 36 is preferably 8.7 ppm/K or more, and more preferably 9 ppm/K or more. The thermal expansion coefficient of the first substrate 36 may be 12 ppm/K or less.

The second substrate 70 is bonded to the back side of the pyroelectric substrate 20, and supports the infrared detection element 15 from the back side of the pyroelectric substrate 20. As the material of the second substrate 70, silicon or alumina is given as an example. Although not particularly limited, for example, the second substrate 70 is 1 to 20 mm in length, 1 to 20 mm in width, and 0.1 to 2 mm in thickness. The second substrate 70 is configured as a circuit board having unillustrated electric wiring provided on a surface facing toward the pyroelectric substrate 20. The electric wiring is electrically connected to the conductive adhesive material 81 and the conductive adhesive material 82. Preferably, the thermal expansion coefficient of the second substrate 70 is lower than the thermal expansion coefficients of the pyroelectric substrate 20 and the first substrate 36. When the thermal expansion coefficient of the second substrate 70 is lower than the thermal expansion coefficient of the pyroelectric substrate 20, deformation of the pyroelectric substrate 20 due to thermal expansion can be suppressed not only by the first substrate 36 but also by the second substrate 70. Further, when the thermal expansion coefficient of the second substrate 70 is lower than the thermal expansion coefficient of the first substrate 36, deformation of the pyroelectric substrate 20 can be suppressed further. It is considered that the effect of the second substrate 70 for suppressing deformation of the pyroelectric substrate 20 is apt to be smaller than that of the first substrate 36 because the second substrate 70 is bonded to the pyroelectric substrate 20 with the conductive adhesive materials 81 and 82. That is, it is considered that, when the thermal expansion coefficient of the second substrate 70 is lower than that of the first substrate 36, the balance of the effect for suppressing deformation of the pyroelectric substrate 20 can be achieved between the first substrate 36 and the second substrate 70.

The conductive adhesive materials 81 and 82 bond the back side of the pyroelectric substrate 20 to the second substrate 70 to fix the infrared detection element 15 to the second substrate 70 and to electrically connect the back-side electrodes 51 and 52 to the electric wiring on the second substrate 70. Specifically, the conductive adhesive material 81 bonds the electric wiring on the second substrate 70 to the back-side electrode lead portion 56 to make electric connection therebetween. The conductive adhesive material 82 bonds the electric wiring on the second substrate 70 to the back-side electrode lead portion 57 to make electric connection therebetween. As the material of the conductive adhesive materials 81 and 82, a material in which metal, such as silver, or carbon is added to epoxy or urethane resin is given as an example. Although not particularly limited, for example, the conductive adhesive materials 81 and 82 are each 0.1 to 0.5 mm in diameter and 10 to 100 µm in thickness.

These conductive adhesive materials 81 and 82 are located such as to overlap with the first substrate 36 when the infrared detection element 15 is virtually seen through from the first substrate 36 side (see FIG. 4). In other words, at least a part of each of the conductive adhesive materials 81 and 82 is provided just below the first substrate 36 in FIG. 3. Further, the conductive adhesive materials 81 and 82 are located such as not to protrude from the first substrate 36 when the infrared detection element 15 is virtually seen through from the first substrate 36 side. The conductive adhesive material 81 is located to overlap with the back-side electrode lead portion 56 when the infrared detection element 15 is virtually seen through from the first substrate 36 side, and the conductive adhesive material 82 is located to overlap with the back-side electrode lead portion 57 when the infrared detection element 15 is virtually seen through from the first substrate 36 side. Thus, electric connection can be more reliably achieved between the back-side electrode 51 and the second substrate 70 and between the back-side electrode 52 and the second substrate 70 via the back-side electrode lead portions 56 and 57 and the conductive adhesive materials 81 and 82.

Figure 6:
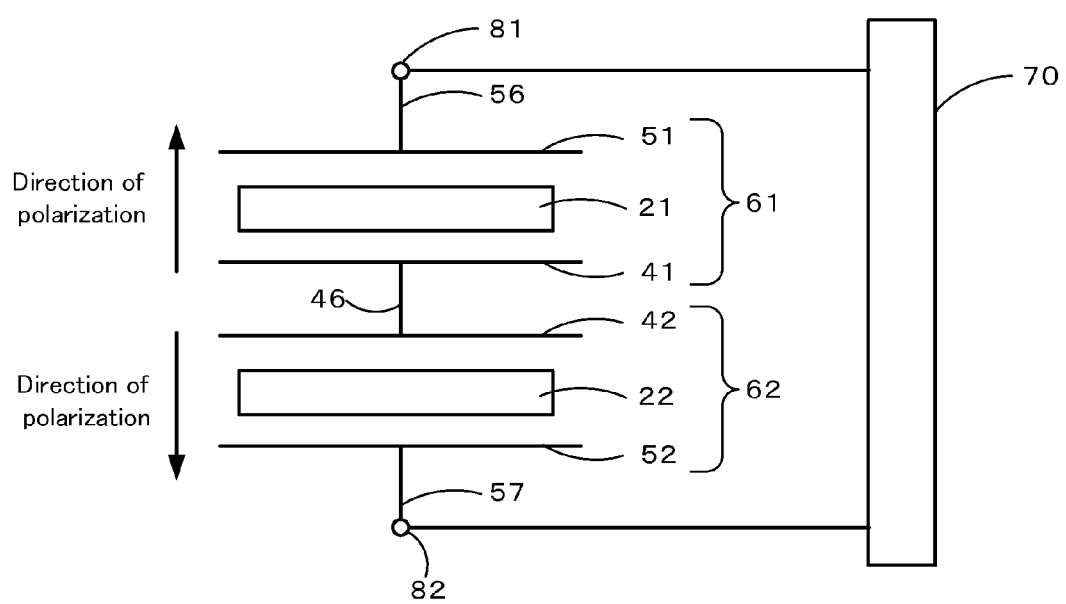
FIG. 6 is a circuit diagram illustrating an electric connection state of light receiving sections 61 and 62.

Next, a description will be given of the operation of the infrared detection module 10 thus configured. FIG. 6 is a circuit diagram illustrating an electric connection state of the light receiving sections 61 and 62. As illustrated in the figure, the light receiving sections 61 and 62 in the infrared detection element 15 are connected in series by connection of the front-side electrodes 41 and 42 through the front-side electrode lead portion 46. A voltage between the back-side electrodes 51 and 52 at both ends of the serially-connected circuit can be extracted as a voltage between the conductive adhesive materials 81 and 82 to the second substrate 70 via the back-side electrode lead portions 56 and 57. In this embodiment, the directions of spontaneous polarization in the light receiving regions 21 and 22 are opposite from each other in FIG. 6 (whereas they are the same in FIG. 3). In the infrared detection element 15, since the pyroelectric substrate 20 is made of a pyroelectric material, spontaneous polarization always takes place in the light receiving regions 21 and 22 even under normal conditions. However, since the light receiving sections 61 and 62 adsorb floating electric charge in the air to be electrically balanced with the spontaneous polarization, apparent electric charge is zero in both the light receiving regions 21 and 22. For this reason, since no voltage is generated between the front-side electrode 41 and the back-side electrode 51 and between the front-side electrode 42 and the back-side electrode 52 under normal conditions, no voltage is generated between the conductive adhesive materials 81 and 82. If a change in the amount of infrared light in the atmosphere surrounding the infrared detection element 15 (for example, a change in ambient temperature) causes the temperatures of the light receiving sections 21 and 22 to change in a similar manner, a change in spontaneous polarization occurs in both the light receiving sections 21 and 22. This results in an imbalance of electric charge and generates voltages of equal magnitude between the front-side electrode 41 and the back-side electrode 51 and between the front-side electrode 42 and the back-side electrode 52. However, since the directions of spontaneous polarization in the light receiving regions 21 and 22 are opposite from each other, as illustrated in FIG. 6, the voltages cancel out each other and no voltage is generated between the conductive adhesive materials 81 and 82. In this way, the infrared detection element 15 is a dual-type element in which the light receiving sections 61 and 62 are connected in series such that the directions of spontaneous polarization are opposite from each other. Therefore, not only under normal conditions but also when there is a change in the amount of infrared light in the atmosphere surroundings the infrared detection element 15, no voltage is generated between the conductive adhesive materials 81 and 82 and a malfunction is unlikely to be caused by noise. On the other hand, when the light receiving sections 61 and 62 are irradiated with different amounts of infrared light, for example, when a person passes by the infrared detection element 15, the temperatures of the light receiving regions 21 and 22 are changed by different amounts. Because of these temperature changes, a voltage generated between the front-side electrode 41 and the back-side electrode 51 is different from a voltage generated between the front-side electrode 42 and the back-side electrode 52. Since these voltages do not completely cancel out each other, a voltage is generated between the conductive adhesive materials 81 and 82. Thus, the infrared detection module 10 can be used as an infrared detection device for human detection, fire detection, etc. When the infrared detection element 15 is used as an infrared detection device, for example, a voltage between the back-side electrode lead portions 56 and 57 can be easily extracted by connecting the back-side electrode lead portions 56 and 57 to an FET (field-effect transistor) for impedance conversion. The infrared absorption efficiency can be improved by covering the front-side electrodes 41 and 42 with an infrared absorbing layer made of gold black, and a malfunction due to noise can be prevented by using a wavelength filter that allows light of only a specific wavelength to reach the light receiving regions 21 and 22.

Figure 7:
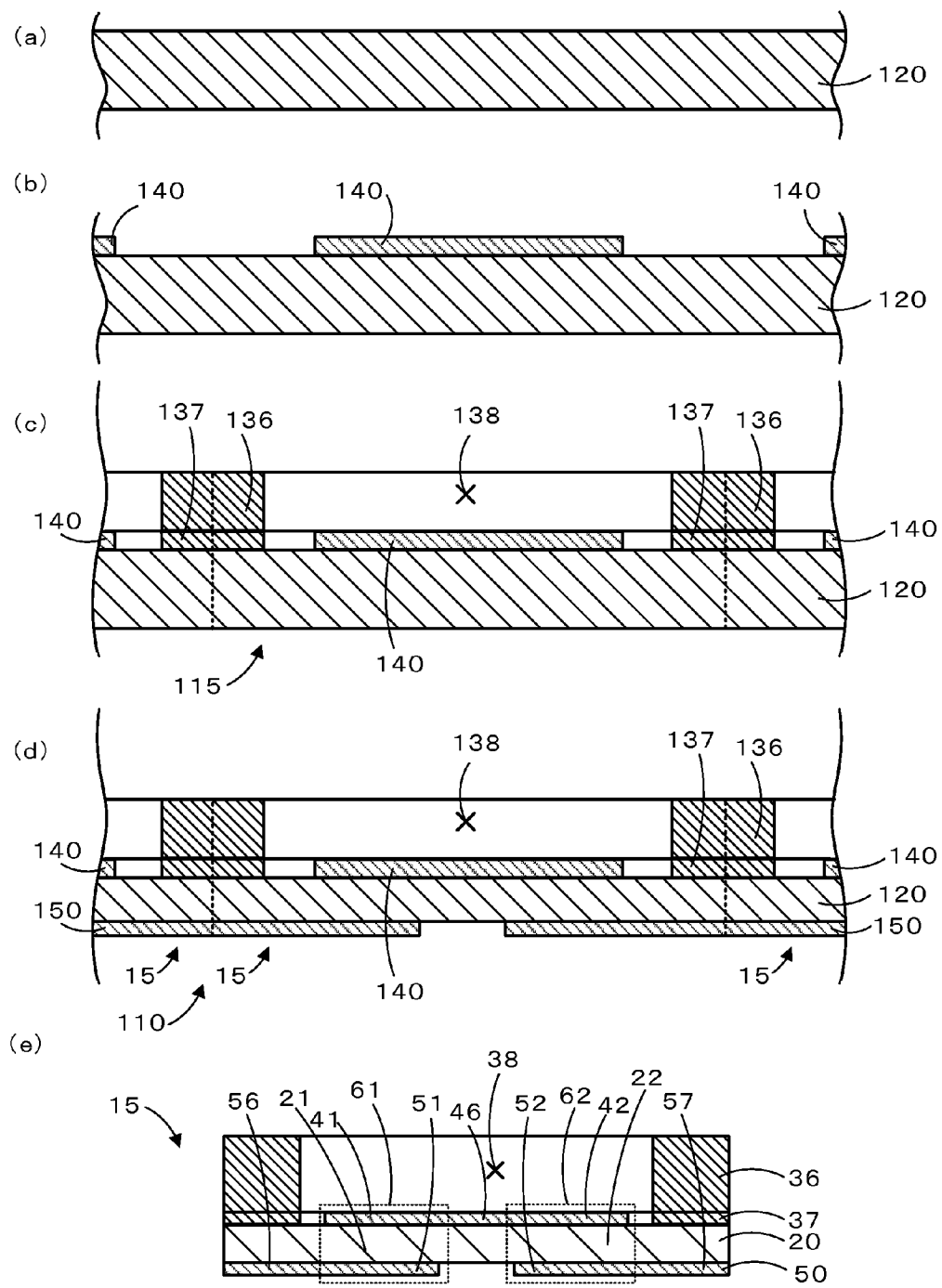
FIG. 7 includes cross-sectional views schematically illustrating manufacturing steps for an infrared detection element 15.
Figure 8:
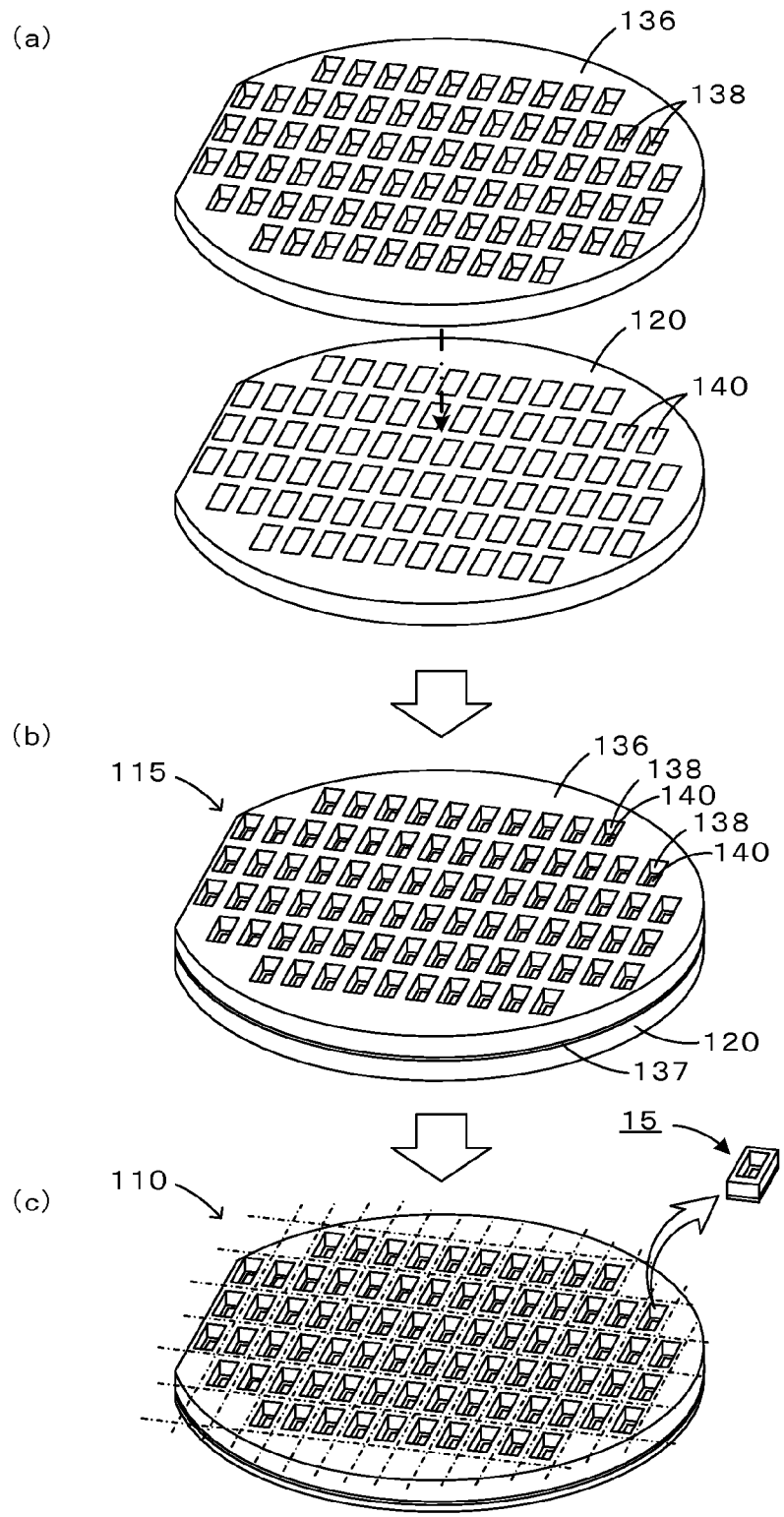
FIG. 8 includes explanatory views schematically illustrating manufacturing steps for the infrared detection element 15.

Next, a manufacturing method for this infrared detection module 10 will be described. First, a manufacturing method for the infrared detection element 15 will be described. FIG. 7 includes cross-sectional views schematically illustrating steps of manufacturing the infrared detection element 15. FIG. 8 includes explanatory views schematically illustrating steps of manufacturing the infrared detection element 15. First, a flat pyroelectric substrate 120 to become individual pyroelectric substrates 20 is prepared (FIG. 7(a)). For example, this pyroelectric substrate 120 is a wafer that has an orientation flat (OF) and is large enough to allow a plurality of pyroelectric substrates 20 to be cut out therefrom. The material of the pyroelectric substrate 120 can be the same as the above-described one. The size of the pyroelectric substrate 120 is not particularly limited, but can be, for example, 50 to 100 mm in diameter and 200 μm to 1 mm in thickness.

Next, front-side metal layers 140 to become individual front-side metal layers 40 are formed on a front side of the pyroelectric substrate 120 (FIG. 7(b), FIG. 8(a)). The front-side metal layers 140 are obtained by forming a plurality of patterns, which are to become front-side metal layers 40, on the front side of the pyroelectric substrate 120. The material of the front-side metal layers 140 can be the same as the above-described one. The thickness of the front-side metal layers 140 is not particularly limited, but is, for example, 0.01 to 0.2 μm. The front-side metal layers 140 can be formed, for example, by vacuum evaporation using a metal mask that covers the pyroelectric substrate 120 except for areas where the front-side metal layers 140 are to be formed. The front-side metal layers 140 may be formed by sputtering, photolithography, or screen printing instead.

Subsequently, a first substrate 136 to become individual first substrates 36 is bonded to the front side of the pyroelectric substrate 120 with a bonding layer 137 being disposed therebetween (FIG. 7(c), FIG. 8(b)). The first substrate 136 is a wafer that has an orientation flat (OF) and is large enough to allow a plurality of first substrates 36 to be cut out therefrom. The material and thickness of the first substrate 136 can be the same as the above-described ones. The size of the first substrate 136 is not particularly limited, but, for example, the first substrate 136 can be 50 to 100 mm in diameter. Multiple rectangular holes 138 are formed in the first substrate 136 beforehand, for example, by water-jet machining (see FIG. 8(a)). The first substrate 136 is to be divided into individual first substrates 36 by dicing and the rectangular holes 138 are to be separated into individual cavities 38 by dicing. The bonding layer 137 is divided into individual bonding layers 37 described above. The material of the bonding layer 137 can be the same as the above-described one. For example, the pyroelectric substrate 120 and the first substrate 136 are bonded as follows. First, the bonding layer 137 is applied to the entire surface of the pyroelectric substrate 120 on which the front-side metal layers 140 are formed, and the pyroelectric substrate 120 and the first substrate 136 are bonded while performing alignment such that the rectangular holes 138 of the bonding layer 137 are located on the front-side metal layers 140. After the bonding layer 137 is cured, portions of the bonding layer 137 exposed in the rectangular holes 138 are removed by, for example, sputtering using Ar ions. Thus, a composite body 115 is obtained in which the first substrate 136 is bonded to the front side of the pyroelectric substrate 120 with the bonding layer 137 being disposed therebetween.

Next, a back surface of the pyroelectric substrate 120 in the composite body 115 is polished until the thickness of the pyroelectric substrate 120 reaches a predetermined thickness. After that, back-side metal layers 150 to become back-side metal layers 50 are formed on the back surface of the pyroelectric substrate 120 (FIG. 7(d)). The back-side metal layers 150 are obtained by forming, on the back side of the pyroelectric substrate 120, a plurality of patterns to become back-side metal layers 50. The back-side metal layers 150 are formed such that portions of the front-side metal layers 140 to become front-side electrodes 41 and 42 are paired with respective portions to become back-side electrodes 51 and 52. The material of the back-side metal layers 150 can be the same as the above-described one. The thickness of the back-side metal layers 150 is not particularly limited, but is, for example, 0.01 to 0.2 μm. The back-side metal layers 150 can be formed in a manner similar to that for the front-side metal layers 140. Thus, a composite body 110 is formed as a collection of multiple infrared detection elements 15.

Then, individual infrared detection elements 15 are cut out from the composite body 110 having the back-side metal layers 150 (FIG. 7(e), FIG. 8(c)). Thus, a plurality of infrared detection elements 15, which are illustrated in FIGS. 1 to 4, are obtained. One-dot chain lines in FIG. 8(c) show cutoff lines for dicing.

Figure 9:
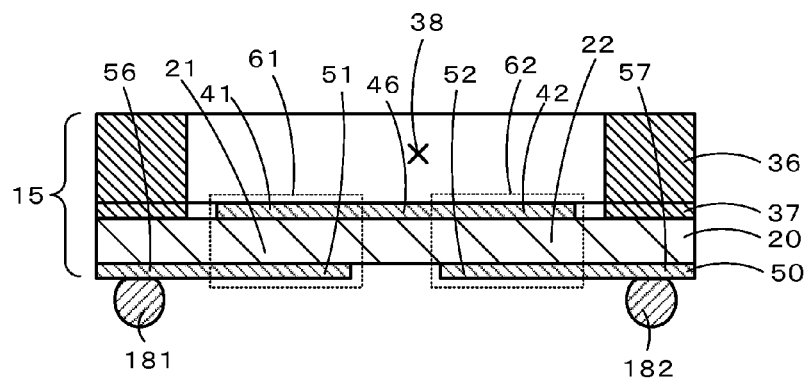
FIG. 9 includes cross-sectional views schematically illustrating mounting steps for the infrared detection element 15.
Figure 9:
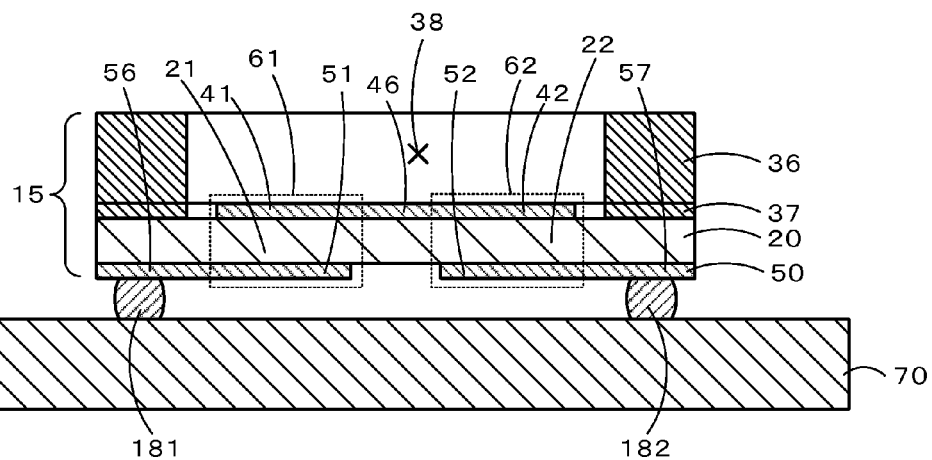
Figure 9:
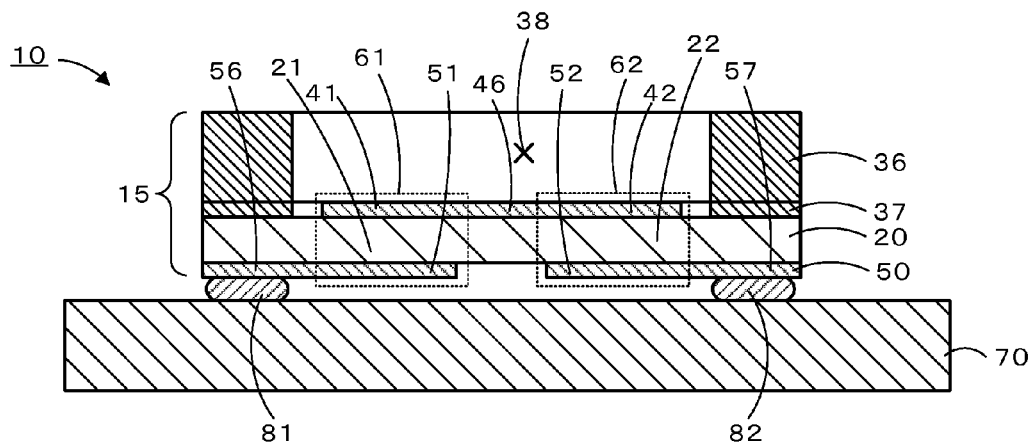

Next, steps of mounting each infrared detection element 15 on a second substrate 70 will be described. FIG. 9 includes cross-sectional views schematically illustrating the steps of mounting the infrared detection element 15. When the infrared detection element 15 is prepared through the above-described steps, first, conductive adhesive materials 181 and 182 are applied onto the back side of the pyroelectric substrate 20 in the infrared detection element 15 such as to make electric connection to the back-side electrode lead portions 56 and 57 (FIG. 9(a)). The conductive adhesive materials 181 and 182 are to be turned into the conductive adhesive materials 81 and 82 described above, and the material of the conductive adhesive materials 181 and 182 can be the same as the above-described one. The conductive adhesive materials 181 and 182 are applied to positions such as to overlap with the first substrate 36 when the infrared detection element 15 is virtually seen through from the first substrate 36 side. Specifically, the conductive adhesive material 181 is applied to a position such as to overlap with the first substrate 36 and the back-side electrode lead portion 56 when the infrared detection element 15 is virtually seen through from the first substrate 36 side. The conductive adhesive material 182 is applied to a position such as to overlap with the first substrate 36 and the back-side electrode lead portion 57 when the infrared detection element 15 is virtually seen through from the first substrate 36 side.

Next, a second substrate 70 is prepared, and the second substrate 70 is bonded to the back side of the pyroelectric substrate 20 with the conductive adhesive materials 181 and 182 so as to electrically connect the back-side electrode lead portions 56 and 57 and the second substrate 70 (FIG. 9(b)). On the second substrate 70, electric wiring is formed beforehand to be electrically connected to the conductive adhesive materials 181 and 182.

Then, load is applied between the first substrate 36 and the second substrate 70, and the conductive adhesive materials 181 and 182 are cured into conductive adhesive materials 81 and 82 (FIG. 9(c)). Thus, the infrared detection element 15 is bonded to the second substrate 70 with the conductive adhesive materials 81 and 82, and the infrared detection module 10 illustrated in FIGS. 1 to 4 is obtained. Owing to the load applied between the first substrate 36 and the second substrate 70, the conductive adhesive materials 81 and 82 spread more in a surface direction of the pyroelectric substrate 20 (a right-left direction of FIG. 9) than the conductive adhesive materials 181 and 182. For this reason, the conductive adhesive materials 181 and 182 are applied by taking into consideration such that the conductive adhesive materials 81 and 82 in the spread state do not protrude from the first substrate 36 when the infrared detection element 15 is virtually seen through from the first substrate 36 side.

Here, when the load is applied between the first substrate 36 and the second substrate 70, stress due to the load is imposed on portions of the pyroelectric substrate 20 where the conductive adhesive materials 181 and 182 are provided. When the conductive adhesive materials 181 and 182 are cured, stress is sometimes imposed because the conductive adhesive materials 181 and 182 contract. In this embodiment, since the conductive adhesive materials 181 and 182 are located such as to overlap with the first substrate 36 when the infrared detection element 15 is virtually seen through from the first substrate 36 side, these stresses can be received by the first substrate 36. This can further suppress deformation of the pyroelectric substrate 20 during manufacturing.

In the infrared detection element 15 described in detail above, the first substrate 36 is bonded to the front side of the pyroelectric substrate 20. Since the thermal expansion coefficient of the first substrate 36 is lower than that of the pyroelectric substrate 20, deformation of the pyroelectric substrate 20 due to thermal expansion can be suppressed by the first substrate 36. Further, since the thermal expansion coefficient difference D is 8.9 ppm/K or less, the thermal expansion coefficient difference between the first substrate 36 and the pyroelectric substrate 20 is not excessively large, and deformation of the infrared detection element 15 due to the thermal expansion coefficient difference between the first substrate 36 and the pyroelectric substrate 20 can be suppressed. This can further suppress deformation of the pyroelectric substrate.

The first substrate 36 is shaped like a frame that has the cavity 38 opposed to the front-side electrodes 41 and 42 and that surrounds the periphery of the front-side electrodes 41 and 42. For this reason, the effect of the first substrate 36 for suppressing deformation of the pyroelectric substrate 20 is greater than when the first substrate is shaped such as not to completely surround the periphery of the front-side electrodes.

The thickness of the pyroelectric substrate 20 is 10 μm or less. When the thickness is small, the pyroelectric substrate 20 is liable to deform. Hence, it is highly significant to further suppress deformation of the pyroelectric substrate 20 by making the thermal expansion coefficient of the first substrate lower than that of the pyroelectric substrate and setting the thermal expansion coefficient difference D at 8.9 ppm/K or less.

Since the pyroelectric substrate 20 is made of LT having a high pyroelectric coefficient and a high performance index, sensitivity of the infrared detection element 15 can be increased. Further, since the pyroelectric substrate 20 is a Y-offcut plate of LT, popcorn noise caused by a change in ambient temperature can be suppressed. Still further, a wafer having a diameter larger than that of a Z-cut plate can be used as the pyroelectric substrate 120. Hence, it is possible to increase the number of chips to be cut out from a single wafer (number of pyroelectric substrates 20 that can be cut out).

In the infrared detection module 10, the conductive adhesive materials 81 and 82 for bonding the infrared detection element 15 and the second substrate 70 are located such as to overlap with the first substrate 36 when the infrared detection element 15 is virtually seen through from the first substrate 36 side. This can further suppress deformation of the pyroelectric substrate due to thermal expansion of the conductive adhesive materials 81 and 82 when the pyroelectric substrate is pushed up by thermal expansion of the conductive adhesive materials.

The infrared detection module 10 includes the back-side electrode lead portions 56 and 57 that are provided on the back side of the pyroelectric substrate 20, are electrically connected to the back-side electrodes 51 and 52, and are located such as to overlap with the first substrate 36 when the infrared detection element 15 is virtually seen through from the first substrate 36 side. The conductive adhesive materials 81 and 82 bond the back-side electrode lead portions 56 and 57 to the second substrate 70 to electrically connect the back-side electrode lead portions 56 and 57 and the second substrate 70. For this reason, more reliable electric connection can be achieved between the conductive adhesive materials 81 and 82 and the back-side electrodes 51 and 52.

In this regard, it is needless to say that the present invention is not limited to the above-described embodiment and can be executed in various aspects within the technical scope of the present invention.

For example, in the above-described embodiment, the conductive adhesive materials 81 and 82 do not protrude from the first substrate 36 when the infrared detection element 15 is virtually seen through from the first substrate 36 side. However, it is only necessary that at least a part of each of the conductive adhesive materials 81 and 82 should be located such as to overlap with the first substrate 36 when the infrared detection element 15 is virtually seen through from the first substrate 36 side, and the conductive adhesive materials 81 and 82 may partially protrude from the first substrate 36.

While the first substrate 36 is a member shaped like a frame that has the rectangular cavity 38 therein and surrounds the cavity 38 in a rectangular form in the above-described embodiment, the first substrate 36 may have any shape as long as it has a cavity opposed to the front-side electrodes 41 and 42. For example, the cavity 38 may be circular, or the cavity 38 may partially face the outer periphery of the infrared detection element 15 without being completely surrounded by the first substrate 36. The cavity 38 does not need to be opposed to the entire front-side electrodes 41 and 42, and it is only necessary that the cavity 38 should be opposed to a part of each of the front-side electrodes 41 and 42.

While the pyroelectric substrate 20 and the second substrate 70 are bonded after the conductive adhesive materials 181 and 182 are applied on the back side of the pyroelectric substrate 20 in the above-described embodiment, the process is not limited thereto as long as bonding is performed such that the conductive adhesive materials 181 and 182 are located to overlap with the first substrate 36 when the infrared detection element 15 is virtually seen through from the first substrate 36 side. For example, the pyroelectric substrate 20 and the second substrate 70 may be bonded after the conductive adhesive materials 181 and 182 are applied on the surface of the second substrate 70 to be bonded to the pyroelectric substrate 20.

While the thickness of the pyroelectric substrate 20 is 10 μm or less in the above-described embodiment, it may exceed 10 μm.

While the pyroelectric substrate 20 is a Y-offcut plate of LT in the above-described embodiment, for example, LT having a form different from the Y-offcut plate, for example, a Z-plate of LT may be used as the pyroelectric substrate 20. The pyroelectric substrate 20 is not limited to LT as long as it is formed of a pyroelectric material. For example, the pyroelectric substrate 20 may be formed of a ferroelectric ceramic material such as lead zirconate titanate.

In the above-described embodiment, the conductive adhesive material 81 is located such as to overlap with the back-side electrode lead portion 56 when the infrared detection element 15 is virtually seen through from the first substrate 36 side, and the conductive adhesive material 82 is located such as to overlap with the back-side electrode lead portion 57 when the infrared detection element 15 is virtually seen through from the first substrate 36 side. The structure is not limited thereto. For example, the conductive adhesive material 81 and the back-side electrode lead portion 56 may be located such as not to overlap with each other. Further, the conductive adhesive material 82 and the electrode lead portion 57 may be located such as not to overlap with each other. Alternatively, the back-side electrode lead portions 56 and 57 may be omitted. In this case, the conductive adhesive material 81 and the back-side electrode 51 may be directly and electrically connected and the conductive adhesive material 82 and the back-side electrode 52 may be directly and electrically connected in a manner such that a part of each of the back-side electrode 51 and the back-side electrode 52 is located to overlap with the first substrate when the infrared detection element 15 is virtually seen through from the first substrate 36 side.

While the front-side metal layers 140 to become the front-side metal layers 40 are integrally formed on the front side of the pyroelectric substrate 120 in the above-described embodiment, the front-side metal layers 41 and 42 and the front-side electrode lead portions 46 may be formed separately. Similarly, while the back-side metal layers 150 to become the back-side metal layers 50 are integrally formed on the back side of the pyroelectric substrate 120 in the above-described embodiment, the back-side metal layers 51 and 52 and the back-side electrode lead portions 56 and 57 may be formed separately. For example, the back-side electrode lead portions 56 and 57 may be formed after individual infrared detection elements are cut out.

Figure 10:
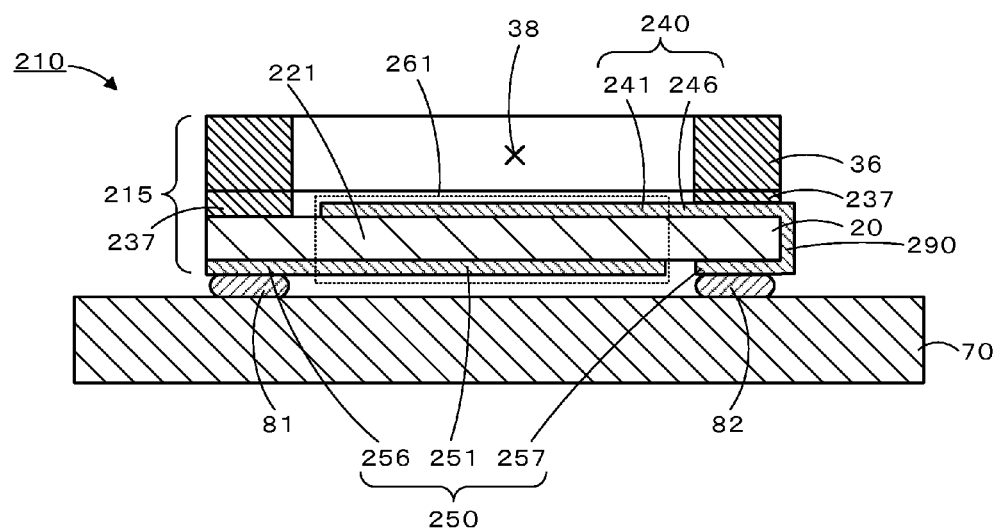
FIG. 10 is a cross-sectional view of an infrared detection module 210 according to a modification including a single type infrared detection element 215.

While the infrared detection element 15 is of a dual type in the above-described embodiment, it may be of a single type including one front-side electrode and one back-side electrode or a quad type including four front-side electrodes and four back-side electrodes. FIG. 10 is a cross-sectional view of an infrared detection module 210 serving as a modification including an infrared detection element 215 of a single type. In FIG. 10, the same constituent elements as those adopted in the infrared detection module 10 of FIG. 3 are denoted by the same reference numerals, and descriptions thereof are omitted. The infrared detection module 210 includes an infrared detection element 215. The infrared detection element 215 includes a pyroelectric substrate 20, a front-side metal layer 240 provided on a front side of the pyroelectric substrate 20, a back-side metal layer 250 provided on a back side of the pyroelectric substrate 20, a side metal layer 290 provided on a side surface of the pyroelectric substrate 20, and a first substrate 36 bonded to the front side of the pyroelectric substrate 20 with a bonding layer 237 being disposed therebetween. The front-side metal layer 240 includes a front-side electrode 241 and a front-side electrode lead portion 246. The front-side electrode 241 is provided within a cavity 38, and the first substrate 36 is provided to avoid the front-side electrode 241. A part of the front-side electrode lead portion 246 is provided just below the first substrate 36 in FIG. 10, and is electrically connected to the front-side electrode 241 and the side metal layer 290. The back-side metal layer 250 includes a back-side electrode 251 opposed to the front-side electrode 241, a back-side electrode lead portion 256, and a front-side electrode lead portion 257. The back-side electrode lead portion 256 is electrically connected to the back-side electrode 251, and is located such that the first substrate 36 overlaps with at least a part of the back-side electrode lead portion 256 when the infrared detection element 215 is virtually seen through from the first substrate 36 side. The front-side electrode lead portion 257 is not electrically connected to the back-side electrode 251, but is electrically connected to the side metal layer 290. The front-side electrode lead portion 257 is located such that at least a part thereof overlaps with the first substrate 36 when the infrared detection element 215 is virtually seen through from the first substrate 36 side. The side metal layer 290 is electrically connected to the front-side electrode lead portion 246 and the front-side electrode lead portion 257. Thus, the front-side electrode 241 and the front-side electrode lead portion 257 are electrically connected to each other. The front-side electrode 241, the back-side electrode 251, and a light receiving region 221 serving as a portion of the pyroelectric substrate 20 interposed between the front-side electrode 241 and the back-side electrode 251 constitute a light receiving section 261. A conductive adhesive material 81 is electrically connected to the back-side electrode lead portion 256, and is located such as to overlap with the first substrate 36 and the back-side electrode lead portion 256 when the infrared detection element 215 is virtually seen through from the first substrate 36 side. A conductive adhesive material 82 is electrically connected to the front-side electrode lead portion 257, and is located such as to overlap with the first substrate 36 and the front-side electrode lead portion 257 when the infrared detection element 215 is virtually seen through from the first substrate 36 side. For example, the front-side electrode 241 and the back-side electrode 251 are each shaped like a rectangle, and the front-side electrode lead portions 246 and 257 and the back-side electrode lead portion 256 are each shaped like a square. In the infrared detection module 210 thus configured, a voltage between the front-side electrode 241 and the back-side electrode 251 can be extracted as a voltage between the conductive adhesive materials 81 and 82 to the second substrate 70 via the front-side electrode lead portions 246 and 257, the back-side electrode lead portion 256, and the side metal layer 290. In the infrared detection module 210, deformation of the pyroelectric substrate 20 can also be further suppressed, similarly to the above-described embodiment. The infrared detection module 210 can be manufactured by a method similar to that for the above-described infrared detection module 10 except that formation patterns of the front-side metal layer 240 and the back-side metal layer 250 are different. The side metal layer 290 can be formed by a method similar to that for the front-side metal layer and the back-side metal layer after individual infrared detection elements 215 are cut out, as illustrated in FIG. 7(e). The shapes of a front-side electrode and a back-side electrode in infrared detection elements of a single type and a quad type are described in, for example, Japanese Unexamined Patent Application Publication No. 2006-203009. In the quad type, for example, four conductive adhesive materials may be adopted in accordance with the number of back-side electrodes, and the number of conductive adhesive materials is not limited to two.

EXAMPLES

Experimental Example 1

As Experimental Example 1, the infrared detection module 10 of the embodiment was manufactured by the above-described method.

First, a pyroelectric substrate 120 formed by an LT substrate including an OF portion and having a diameter of 4 inches and a thickness of 350 μm (having a thermal expansion coefficient of 17 ppm/K) was prepared (FIG. 7(a)). As the pyroelectric substrate 120, a 48° Y-offcut plate (cut angle) θ=48° was used. The pyroelectric substrate 120 is to be divided into pyroelectric substrates 20 by dicing. Subsequently, multiple front-side metal layers 140 made of nickel and chromium were formed on a front side of the pyroelectric substrate 120 (FIG. 7(b), FIG. 8(a)). The front-side metal layers 140 were formed by vacuum evaporation using a metal mask that covered the pyroelectric substrate 120 except for areas where the front-side metal layers 140 were to be formed. Vacuum evaporation was performed by first depositing a chromium film at a deposition rate of 5 Å/s until a thickness of 0.02 μm was reached, and then depositing a nickel film at a deposition rate of 10 Å/s until a thickness of 0.1 μm was reached. During film deposition using vacuum evaporation, the pressure was $2.7 \times 10^{-4}$ Pa, and the temperature of the pyroelectric substrate 120 was about 100° C. Thus, front-side metal layers 140 having a thickness of 0.12 μm were formed. The pattern of the front-side metal layers 140 was formed such that front-side metal layers 40 of a shape illustrated in FIGS. 1, 2, and 4 were formed after dicing. Specifically, the pattern was formed such that portions to become front-side electrodes 41 and 42 were 2 mm in length and 0.5 mm in width, and such that portions to become front-side electrode lead portions 46 were 0.1 mm in length and 0.5 mm in width.

Next, a first substrate 136 serving as a glass substrate including an OF portion and having a diameter of 4 inches and a thickness 500 μm (having a thermal expansion coefficient of 12 ppm/K) was prepared, and multiple rectangular holes 138, each having a length of 2.1 mm and a width of 2.1 mm, were formed therein by water-jet machining (see FIG. 8(a)). The first substrate 136 is to be divided into individual first substrates 36 by dicing, and the rectangular holes 138 are to be separated into individual cavities 38 by dicing.

Next, epoxy adhesive was applied in a thickness of 1 μm onto the front side of the pyroelectric substrate 120. The pyroelectric substrate 120 was aligned with and bonded to the first substrate 136 such that the portions to become front-side electrodes 41 and 42 were located within the respective rectangular holes 138 of the first substrate 136. Then, the thickness of the epoxy adhesive was reduced to 0.1 μm by press bonding, and the pyroelectric substrate 120 bonded to the first substrate 136 was left for one hour at a temperature of 200° C. The epoxy adhesive was thereby cured to form a bonding layer 137 (FIG. 7(c), FIG. 8(b)). The bonding layer 137 is to be divided into individual bonding layers 37 by dicing. After that, the epoxy adhesive in the rectangular holes 138, including the epoxy adhesive attached to the portions of the front-side metal layers 140 which were to become front-side electrodes 41 and 41, were removed by sputtering using Ar ions.

Then, an obtained composite body was turned upside down. The first substrate 136 was secured by bonding to a polishing jig made of silicon carbide. A surface of the pyroelectric substrate 120 to which the first substrate 136 was not bonded was ground with a grinder with fixed abrasive grains until the thickness of the pyroelectric substrate 120 was reduced to 50 μm. That surface was further polished with diamond abrasive grains until the thickness was reduced to 12 μm. After that, this surface was subjected to final polishing with loose abrasive grains and a non-woven polishing pad until the thickness of the pyroelectric substrate 120 reached 10 μm. The final polishing was performed to remove an affected layer formed on the pyroelectric substrate 120 by polishing with diamond abrasive grains.

After the pyroelectric substrate 120 was thus polished, multiple back-side metal layers 150 were formed on the back side of the pyroelectric substrate 120 (side where the front-side metal layers 140 were not formed) (FIG. 7(d)). This step was performed using the same material and under the same condition as those for forming the front-side metal layers 140. The pattern of the back-side metal layers 150 was formed such that back-side metal layers 50 of the shape illustrated in FIGS. 1 to 4 were formed by dicing. Specifically, the pattern was formed such that portions to become back-side electrodes 51 and 52 were 2 mm in length and 0.5 mm in width and such that portions to become back-side electrode lead portions 56 and 57 were 0.5 mm in length and 0.5 mm in width. Then, infrared detection elements 15 each having a length of 2.5 mm and a width of 2.5 mm were cut out from a composite body 110 having the back-side metal layers 150 by dicing (FIG. 7(e), FIG. 8(c)).

Next, conductive adhesive materials 181 and 182, in which silver particles were dispersed in epoxy adhesive, were applied on the back side of the pyroelectric substrate 20 in each infrared detection element 15 so as to make electric connection to the back-side metal layer 40 (FIG. 9(*a*)). This application was performed at positions where the conductive adhesive materials 181 and 182 overlapped with the first substrate 36 when the infrared detection element 15 was virtually seen through from the first substrate 36 side. Specifically, the conductive adhesive material 181 was applied to a position such as to overlap with the first substrate 36 and the back-side electrode lead portion 56 when the infrared detection element 15 was virtually seen through from the first substrate 36 side. The conductive adhesive material 182 was applied to a position such as to overlap with the first substrate 36 and the back-side electrode lead portion 57 when the infrared detection element 15 was virtually seen through from the first substrate 36 side.

Next, a circuit board in which electric wiring was provided on a silicon substrate (having a thermal expansion coefficient of 3 ppm/K) was prepared as a second substrate 70, and the second substrate 70 was bonded to the back side of the pyroelectric substrate 20 with the conductive adhesive materials 181 and 182 so as to electrically connect the back-side electrode lead portions 56 and 57 to the second substrate 70 (FIG. 9(*b*)). At the time of bonding, alignment was performed such that the conductive adhesive materials 181 and 182 were located on the electric wiring of the second substrate 70. After that, the second substrate 70 and the infrared detection element 15 were fixed by applying a load of about 1 kgf between the first substrate 36 and the second substrate 70, and were left for one hour at a temperature of 100° C. in this state. The conductive adhesive materials 181 and 182 were thereby cured and the infrared detection element 15 was bonded to the second substrate 70 with the conductive adhesive materials 81 and 82 (FIG. 9(*c*)). Thus, an infrared detection module 10 having the structure illustrated in FIGS. 1 to 4 was obtained.

Experimental Examples 2 to 10

Infrared detection modules 10 of Experimental Examples 2 to 10 were manufactured in a manner similar to that adopted in Experimental Example 1 except that the thermal expansion coefficient of a glass substrate to become a first substrate 36 was different from that adopted in Experimental Example 1.

Experimental Example 11

An infrared detection module 10 of Experimental Example 11 was manufactured in a manner similar to that adopted in Experimental Example 1 except that a circuit board having electric wiring on an alumina substrate (thermal expansion coefficient: 7 ppm/K) was used as a second substrate 70.

Experimental Examples 12 to 20

Infrared detection modules 10 of Experimental Examples 12 to 20 were manufactured in a manner similar to that adopted in Experimental Example 11 except that the thermal expansion coefficient of a glass substrate to become a first substrate 36 was different from that adopted in Experimental Example 11.

Experimental Example 21

Figure 11:
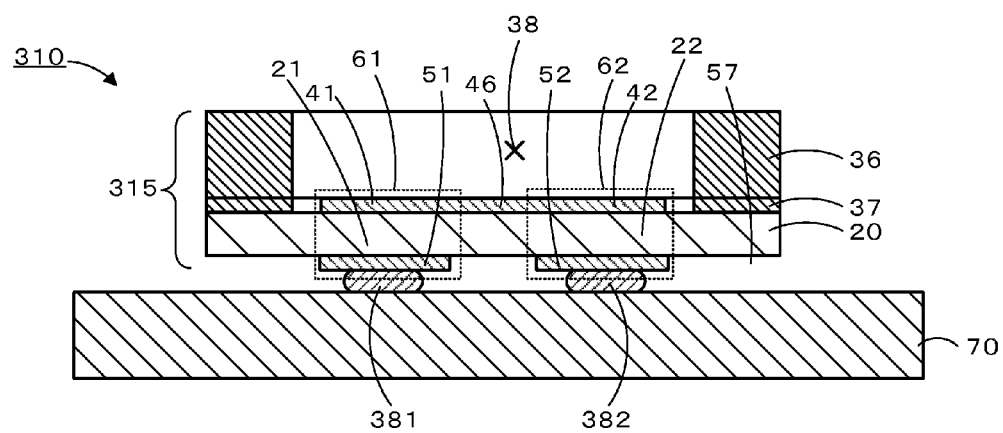
FIG. 11 is a cross-sectional view of an infrared detection module 310 according to Experimental Example 21.

As Experimental Example 21, an infrared detection module was manufactured in which conductive adhesive materials were located such as not to overlap with a first substrate when an infrared detection element was virtually seen through from the first substrate side. FIG. 11 is a cross-sectional view of an infrared detection module 310 of Experimental Example 21. In FIG. 11, the same constituent elements as those of the above-described infrared detection module 10 are denoted by the same reference numerals, and descriptions thereof are omitted. In an infrared detection element 315 of the infrared detection module 310, only a back-side electrode 51 and a back-side electrode 52 are provided as back-side metal layers on a back side of a pyroelectric substrate 20, but back-side electrode lead portions 56 and 57 are not provided thereon. A conductive adhesive material 381 directly and electrically connects the back-side electrode 51 and a second substrate 70, and a conductive adhesive material 382 directly and electrically connects the back-side electrode 52 and the second substrate 70. The conductive adhesive material 381 is located such as to overlap with the back-side electrode 51 and the conductive adhesive material 382 is located such as to overlap with the back-side electrode 52 when the infrared detection element 315 is virtually seen through from the first substrate 36 side. For this reason, both the conductive adhesive materials 381 and 382 are located such as not to overlap with the first substrate 36 when the infrared detection element 315 is virtually seen through from the first substrate 36 side.

The infrared detection module 310 of Experimental Example 21 was manufactured in a procedure similar to that adopted in Experimental Example 1. That is, the infrared detection module 310 was manufactured similarly to Experimental Example 1 except that a formation pattern of the back-side metal layer and positions where the conductive adhesive materials were applied were different.

Experimental Example 22

An infrared detection module 310 of Experimental Example 22 was manufactured in a manner similar to that adopted in Experimental Example 21 except that a circuit board having electric wiring on an alumina substrate (thermal expansion coefficient: 7 ppm/K) was used as a second substrate 70.

Experimental Example 23

An infrared detection module 310 of Experimental Example 23 was manufactured in a manner similar to that adopted in Experimental Example 21 except that the thermal expansion coefficient of a glass substrate to become a first substrate 36 was different from that adopted in Experimental Example 21.

Table 1 lists thermal expansion coefficients of the first substrate 36, thermal expansion coefficient differences D, materials of the second substrate 70, and thermal expansion coefficients of the second substrate 70 in Experimental Examples 1 to 23. Experimental Examples 1 to 5, 11 to 15, and 21 to 23 correspond to examples of the present invention, and the other experimental examples correspond to comparative examples.

Evaluation Test 1

Figure 12:
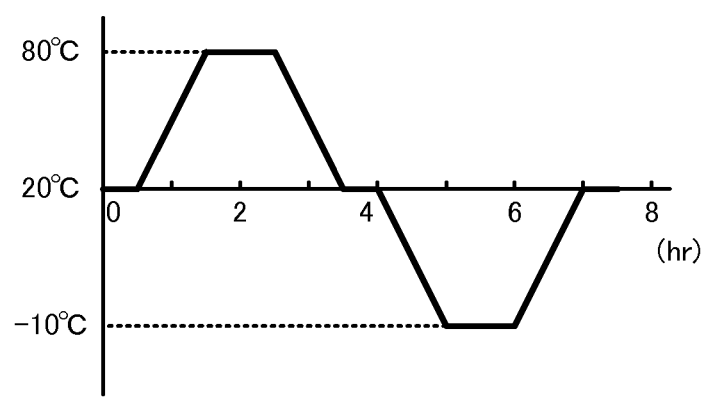
FIG. 12 is an explanatory view of a heat cycle carried out in measurement of piezoelectric noise.

The infrared detection modules of Experimental Examples 1 to 23 were measured for the occurrence of piezoelectric noise. Piezoelectric noise is a voltage generated by a piezoelectric effect of the pyroelectric substrate 20 resulting from deformation of the pyroelectric substrate 20 due to thermal stress. The measurement was performed by conducting a heat cycle test on the infrared detection modules. The heat cycle test was carried out in the following procedure. Each of the infrared detection modules was placed in an environment tester, and the temperature in the environment tester was periodically changed from −10° C. to 80° C. Specifically, the temperature was changed as illustrated in FIG. 12, this change was regarded as one cycle, and a test of 100 cycles in total was performed. It was measured whether or not piezoelectric noise was generated during the test. In each experimental example, ten infrared detection modules were prepared, and the number of infrared detection modules where piezoelectric noise was generated, of the ten infrared detection modules, was found.

The results of Evaluation Test 1 are shown in Table 1. As shown in Table 1, of Experimental Examples in which the thermal expansion coefficient of the first substrate was lower than that of the pyroelectric substrate and the thermal expansion coefficient difference D was 8.9 ppm/K or less, more specifically, the thermal expansion coefficient difference D was within the range of 5 to 8.9 ppm/K (=thermal expansion coefficient of the first substrate 36 was within the range of 8.1 to 12 ppm/K), in Experimental Examples 1 to 5 and 11 to 15, piezoelectric noise did not occur. In Experimental Examples 21 to 23, piezoelectric noise occurred in one module. In contrast, in Experimental Examples 6 to 10 and 16 to 20 in the thermal expansion coefficient difference D was more than 8.9 ppm/K, piezoelectric noise occurred in more modules than in Experimental Examples 1 to 5, 11 to 15, and 21 to 23, and the number of modules where piezoelectric noise occurred tended to increase as the thermal expansion coefficient difference D increased. From these results, it was revealed that deformation of the pyroelectric substrate 20 due to thermal expansion could be further suppressed when the thermal expansion coefficient of the first substrate was lower than that of the pyroelectric substrate and the thermal expansion coefficient difference D was 8.9 ppm/K or less. It is considered that piezoelectric noise is liable to occur when the thermal expansion coefficient difference D exceeds 8.9 ppm/K (=thermal expansion coefficient of the first substrate 36 is less than 8.1 ppm/K) because the thermal expansion coefficient difference between the first substrate 36 and the pyroelectric substrate 20 becomes excessively large and deformation, such as warpage, is caused in the pyroelectric substrate 20 and the infrared detection element 15 by the thermal expansion coefficient difference between the first substrate 36 and the pyroelectric substrate 20.

It is considered that the number of occurrences of noise is smaller in Experimental Examples 1 to 5 and 11 to 15 than in Experimental Examples 21 to 23 for the following reason. That is, in Experimental Examples 21 to 23, both the conductive adhesive materials 381 and 382 are located such as not to overlap with the first substrate 36 when the infrared detection element 315 is virtually seen through the from first substrate 36 side. For this reason, it is considered that the pyroelectric substrate 20 deforms more and piezoelectric noise is more liable to occur when the pyroelectric substrate 20 is pushed up by thermal expansion of the conductive adhesive materials 381 and 382 than in Experimental Example 1. It is considered that, in Experimental Examples 1 to 5 and 11 to 15, deformation of the pyroelectric substrate 20 due to thermal expansion of the conductive adhesive materials can be suppressed more because the first substrate 36 exists just above the conductive adhesive materials.

TABLE 1

| | Thermal expansion coefficient of first substrate (glass substrate) (ppm/K) | Thermal expansion coefficient difference D(*1) (ppm/K) | Material of second substrate | Thermal expansion coefficient of second substrate (ppm/K) | Piezoelectric noise (Number of occurrence/ Number of modules measured) |
|---|---|---|---|---|---|
| Experimental Example 1 | 12 | 5 | Silicon | 3 | 0/10 |
| Experimental Example 2 | 9.7 | 7.3 | Silicon | 3 | 0/10 |
| Experimental Example 3 | 9.4 | 7.6 | Silicon | 3 | 0/10 |
| Experimental Example 4 | 8.7 | 8.3 | Silicon | 3 | 0/10 |
| Experimental Example 5 | 8.1 | 8.9 | Silicon | 3 | 0/10 |
| Experimental Example 6 | 8 | 9 | Silicon | 3 | 4/10 |
| Experimental Example 7 | 7.2 | 9.8 | Silicon | 3 | 6/10 |
| Experimental Example 8 | 6.5 | 10.5 | Silicon | 3 | 9/10 |
| Experimental Example 9 | 4.5 | 12.5 | Silicon | 3 | 10/10 |
| Experimental Example 10 | 3.25 | 13.75 | Silicon | 3 | 10/10 |
| Experimental Example 11 | 12 | 5 | Alumina | 7 | 0/10 |
| Experimental Example 12 | 9.7 | 7.3 | Alumina | 7 | 0/10 |
| Experimental Example 13 | 9.4 | 7.6 | Alumina | 7 | 0/10 |
| Experimental Example 14 | 8.7 | 8.3 | Alumina | 7 | 0/10 |
| Experimental Example 15 | 8.1 | 8.9 | Alumina | 7 | 0/10 |
| Experimental Example 16 | 8 | 9 | Alumina | 7 | 3/10 |

TABLE 1-continued

|  | Thermal expansion coefficient of first substrate (glass substrate) (ppm/K) | Thermal expansion coefficient difference D(*1) (ppm/K) | Material of second substrate | Thermal expansion coefficient of second substrate (ppm/K) | Piezoelectric noise (Number of occurrence/ Number of modules measured) |
|---|---|---|---|---|---|
| Experimental Example 17 | 7.2 | 9.8 | Alumina | 7 | 4/10 |
| Experimental Example 18 | 6.5 | 10.5 | Alumina | 7 | 9/10 |
| Experimental Example 19 | 4.5 | 12.5 | Alumina | 7 | 10/10 |
| Experimental Example 20 | 3.25 | 13.75 | Alumina | 7 | 10/10 |
| Experimental Example 21 | 12 | 5 | Silicon | 3 | 1/10 |
| Experimental Example 22 | 12 | 5 | Alumina | 7 | 1/10 |
| Experimental Example 23 | 8.1 | 8.9 | Silicon | 3 | 1/10 |

(*1)Thermal expansion coefficient difference D = (thermal expansion coefficient of pyroelectric substrate) − (thermal expansion coefficient of first substrate)

Infrared detection modules were manufactured in which, in the structure of the infrared detection module 210 of the modification illustrated in FIG. 10, the materials and thermal expansion coefficients of the first substrate 36 and the second substrate 70 were similar to those adopted in Experimental Examples 1 to 20, and the infrared detection modules were subjected to a test equivalent to the above-described evaluation test. The result of the test was the same as those of Experimental Examples 1 to 20 shown in Table 1.

The present application claims priority from Japanese Patent Application No. 2011-265832 filed on Dec. 5, 2011, the entire contents of which are incorporated in the present specification by reference.

INDUSTRIAL APPLICABILITY

The present invention is applicable to infrared detection devices such as a human sensor used for security and a fire sensor used for gas detection.

What is claimed is:

1. An infrared detection element comprising:
   a pyroelectric substrate;
   a front-side electrode provided on a front side of the pyroelectric substrate;
   a back-side electrode provided on a back side of the pyroelectric substrate to be opposed to the front-side electrode; and
   a first substrate bonded to the front side of the pyroelectric substrate and having a thermal expansion coefficient lower than a thermal expansion coefficient of the pyroelectric substrate,
   wherein the first substrate has a cavity opposed to the front-side electrode, and a thermal expansion coefficient difference D obtained by subtracting the thermal expansion coefficient of the first substrate from the thermal expansion coefficient of the pyroelectric substrate is 8.9 ppm/K or less.

2. The infrared detection element according to claim 1, wherein the pyroelectric substrate has a thickness of 10 μm or less.

3. The infrared detection element according to claim 2, wherein the pyroelectric substrate is a Y-offcut plate obtained by cutting a single crystal of lithium tantalate at an angle turned by a cut angle θ (0°<θ<90°, 90°<θ<180°) from a Y-axis toward a Z-axis about an X-axis that coincides with a direction along surfaces of the electrodes.

4. The infrared detection element according to claim 1, wherein the pyroelectric substrate is a Y-offcut plate obtained by cutting a single crystal of lithium tantalate at an angle turned by a cut angle θ (0°<θ<90°, 90°<θ<180°) from a Y-axis toward a Z-axis about an X-axis that coincides with a direction along surfaces of the electrodes.

5. An infrared detection module comprising:
   the infrared detection element according to claim 1; and
   a second substrate bonded to the back side of the pyroelectric substrate and having a thermal expansion coefficient lower than the thermal expansion coefficient of the pyroelectric substrate.

6. The infrared detection module according to claim 5, further comprising:
   a conductive adhesive material that bonds the infrared detection element and the second substrate to electrically connect the back-side electrode and the second substrate and is located such that at least a part of the conductive adhesive material overlaps with the first substrate when the infrared detection element is virtually seen through from the first substrate side.

7. The infrared detection module according to claim 5, wherein the thermal expansion coefficient of the second substrate is lower than the thermal expansion coefficients of the pyroelectric substrate and the first substrate.

8. A manufacturing method for an infrared detection module in which an infrared detection element is bonded to a second substrate with a conductive adhesive material, the infrared detection element including a pyroelectric substrate, a front-side electrode provided on a front side of the pyroelectric substrate, a back-side electrode provided on a back side of the pyroelectric substrate to be opposed to the front-side electrode, and a first substrate bonded to the front side of the pyroelectric substrate and having a cavity opposed to the front-side electrode, the first substrate having a thermal expansion coefficient lower than a thermal expansion coefficient of the pyroelectric substrate such that a thermal expansion coefficient difference D obtained by subtracting the thermal expansion coefficient of the first substrate from the thermal expansion coefficient of the pyroelectric substrate is 8.9 ppm/K or less, the manufacturing method comprising:
- (a) a step of preparing the infrared detection element;
- (b) a step of bonding the second substrate to the back side of the pyroelectric substrate with the conductive adhesive material to electrically connect the infrared detection element and the second substrate; and
- (c) a step of bonding the infrared detection element to the second substrate with the conductive adhesive material by applying a load between the first substrate and the second substrate, wherein, in the step (b), the bonding is performed such that the conductive adhesive material is located at a position where at least a part of the conductive adhesive material overlaps with the first substrate when the infrared detection element is virtually seen through from the first substrate side.

\* \* \* \* \*